(12) United States Patent
Ozawa (10) Patent No.: US 6,474,531 B2
(45) Date of Patent: Nov. 5, 2002

(54) SEMICONDUCTOR LIGHT-EMITTING DEVICE AND METHOD OF MANUFACTURING THE SAME AND MOUNTING PLATE

(75) Inventor: Masafumi Ozawa, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/729,213

(22) Filed: Dec. 5, 2000

(65) Prior Publication Data

US 2001/0006235 A1 Jul. 5, 2001

(30) Foreign Application Priority Data

Dec. 9, 1999 (JP) ............................................ 11-349757

(51) Int. Cl.⁷ .......................... B23K 31/12; H01L 33/00
(52) U.S. Cl. ......................... 228/103; 257/99; 257/678; 257/750; 438/106
(58) Field of Search ................................ 228/102, 103, 228/180.22; 438/106, 613; 257/99, 678, 750, 96, 97

(56) References Cited

U.S. PATENT DOCUMENTS

| | | | | |
|---|---|---|---|---|
| 4,143,385 | A | * | 3/1979 | Miyoshi et al. ................ 357/19 |
| 5,770,856 | A | * | 6/1998 | Fillard et al. ................. 250/234 |
| 6,054,716 | A | * | 3/2000 | Sonobe et al. ................ 250/552 |
| 6,172,382 | B1 | * | 6/2001 | Nagahama et al. ............ 257/94 |
| 6,281,526 | B1 | * | 8/2001 | Nitta et al. .................. 257/103 |
| 6,323,059 | B1 | * | 11/2001 | Yoshida et al. ............. 438/106 |

FOREIGN PATENT DOCUMENTS

JP 6-7990 A * 1/1994

* cited by examiner

*Primary Examiner*—Tom Dunn
*Assistant Examiner*—L. Edmondson
(74) *Attorney, Agent, or Firm*—Rader, Fishman & Grauer PLLC; Ronald P. Kananen, Esq.

(57) ABSTRACT

To offer a semiconductor light-emitting device capable of preventing a short circuit failure caused by adhesion of the solder, change of a beam shape, and decrease of a beam output. A semiconductor laser device 1 is manufactured by overlaying a laser tip having a p-side electrode and a n-side electrode in a crystalline substrate and a mounting plate having a first solder film and a second solder film in a supporting body. The laser tip has a level difference A such that the p-side electrode is projected beyond the n-side electrode. The mounting plate has a level difference B such that the first solder film is projected beyond the second solder film. The level difference B of the mounting plate is determined as higher than the level difference A of the laser tip. Therefore, when the mounting plate is overlaid to the laser tip, first, the n-side electrode contacts with the second solder film, and then, the p-side electrode contacts the first solder film. Accordingly, even if the solder is squeezed out in the vicinity of the n-side electrode, the solder is hardly squeezed out in the vicinity of the p-side electrode. The pn junction part is generally positioned in the vicinity of the p-side electrode, which controls the solder to adhesion to the pn junction part.

9 Claims, 6 Drawing Sheets

SEMICONDUCTOR LIGHT-EMITTING DEVICE AND METHOD OF MANUFACTURING THE SAME AND MOUNTING PLATE

BACKGROUND OF THE INVENTION

1. Field of the Invention

The present invention relates to a semiconductor light-emitting device including a semiconductor tip having a pair of electrode films in the same side of a mounting plate, to a method of manufacturing the same, and to a mounting plate used for the method thereof.

2. Description of the Related Art

In recent years, semiconductor light-emitting devices including a semiconductor laser device in which a nitride semiconductor such as GaN is employed as a light source for short-wavelength light have been developed. Generally, with the semiconductor laser device utilizing the nitride semiconductor, an n-type layer, an active layer and a p-type layer, which are made of the nitride semiconductor are stacked in sequence on a substrate made of sapphire ($Al_2O_3$). Among a pair of electrode films of the semiconductor laser device, a p-side electrode is formed on the p-type layer which is the most upper layer in the semiconductor layer, while an n-type electrode is formed on the n-type layer which is exposed by etching the p-type layer and the active layer. Hence, the substrate, the semiconductor layer, the p-side electrode and the n-side electrode are collectively called a semiconductor tip.

In the semiconductor light-emitting device, the semiconductor tip is mounted on a mounting plate called a submount. The semiconductor tip is mounted on the mounting plate in a state, in which a side of the semiconductor layer is opposed to the mounting plate in order to scatter heat generated in the semiconductor layer effectively. The mounting plate has a pair of lead electrode layers formed in a side where the semiconductor tip is mounted thereon, and a solder film is formed on the lead layers. After mounting the semiconductor tip on the mounting plate, the p-side and the n-side electrodes of the semiconductor tip respectively contact with a pair of the lead electrode layers via the solder film.

However, in the conventional semiconductor light-emitting device, when the semiconductor tip is worn on the submount, the pressed solder film with the p-side and the n-side electrodes of the semiconductor tip is squeezed out to the side of the solder layer. Then, the squeezed-out solder may adhere to a pn junction part of the semiconductor tip, which causes the short circuit failure.

Additionally, the squeezed-out solder may adhere to a vicinity of an ejection part of a laser beam. In such a case, a shape of the laser beam changes, and what's worse, an optical-power output decreases. If a shape of the laser beam changes as mentioned before, specifically, when this semiconductor light-emitting device is applied to an optical disk apparatus and so on, it leads to less tracking accuracy. On top of that, such decrease of the optical-power output of the laser beam causes increase of heating value, because a large amount of current must be flowed to the semiconductor tip in order to acquire rated output.

SUMMARY OF THE INVENTION

The invention has been achieved in consideration of the above problems and its object is to provide a semiconductor light-emitting device capable of preventing the short circuit failure in the pn junction part caused by adhesion of the solder, change of a beam shape, and decrease of an optical-power output and a method of manufacturing the same and a mounting plate.

A method of manufacturing a semiconductor light-emitting device according to the present invention comprises a step of overlaying a first and second electrode films of a semiconductor tip to a predetermined supporting body by using a first solder film and a second solder film, and in the semiconductor tip, a surface of the first electrode film is projected beyond a surface of the second electrode film in a manner that the deformation amount of the second solder film is larger than that of the first solder film.

Other methods of manufacturing semiconductor light-emitting devices according to the present invention comprises a step of overlaying the first and second electrodes to the first and second solder films of a mounting plate. A semiconductor provides a level difference such that a surface of the first electrode is projected beyond that of the second electrode therebetween. A mounting plate provides a level difference such that a surface of the first solder film is projected beyond a surface of the second solder film therebetween, and the level difference in the mounting plate is determined in a manner to be higher than that of the semiconductor tip.

A mounting plate according to the present invention is provided with the supporting body, the first and second solder films formed in the same side of the supporting body. Between the first solder film and the second solder film, a level difference is formed such that the surface of the first solder film is projected beyond that of the second solder film and is higher than that of the semiconductor tip.

A semiconductor light-emitting device according to the present invention comprises the semiconductor tip having the first and second electrodes in the same side of the mounting plate, and the mounting plate having the first and second solder films in the same side of the supporting body. The semiconductor tip includes the level difference such that the surface of the first electrode film is projected beyond that of the second film therebetween. The mounting plate provides the level difference such that the surface of the first solder film is projected beyond that of the second solder film therebetween. The supporting body has a trench formed in an opposite side to the second solder film as sandwiching the first solder film.

Further, another mounting plate according to the present invention has the first and second solder films in the same side of the supporting body and provides the level difference such that the surface of the first solder film is projected beyond that of the second solder film therebetween. The supporting body has a trench formed in an opposite side to the second solder film as sandwiching the first solder film.

Furthermore, another method of manufacturing a semiconductor light-emitting device according to the present invention comprises a step of overlaying the first and second electrodes of the semiconductor tip to the first and second solder films of the mounting plate. The semiconductor tip provides the level difference such that the surface of the first electrode is projected beyond that of the second electrode. The mounting plate provides the level difference such that the surface of the first solder film is projected beyond that of the second solder film. An outline of the first solder film in a contact surface between the first electrode and the first solder film is positioned inwardly from an outline of the first electrode in the contact surface, at least in a specific direction.

In the method of manufacturing a semiconductor light-emitting device, another method of manufacturing the semiconductor light-emitting device, or the mounting plate according to the present invention, when the semiconductor tip is overlaid to the mounting plate, the first electrode contacts with the first solder film after the second electrode film contacts with the second solder film. Accordingly, even if solder of the second solder film is squeezed out, solder of the first solder film is prevented squeezing out. The pn junction part of the semiconductor tip is generally disposed in a side of the first electrode having an amount of projection larger than the other; hence, the solder may be prevented from adhering to the pn junction part.

In the semiconductor light-emitting device or other mounting plates according to the present invention, the supporting body has the trench formed in the opposite side of the second solder film as sandwiching the first solder film. In case that the solder of the first solder film is squeezed out, the solder flows into the trench, which prevents the solder from adhering to the pn junction part. (The pn junction part is generally disposed in the vicinity of the first electrode film.)

In the other method of manufacturing a semiconductor light-emitting device, an outline of the first solder film in contact surfaces of the first electrode film and the first solder film is positioned inwardly from an outline of the first electrode film (at least in a specific direction). Hence, even the first solder film is applied to pressure, the solder is hardly squeezed out from the out side of the outline of the first electrode film. Accordingly, the solder film is prevented from adhering to the pn junction part of the semiconductor tip.

BRIEF DESCRIPTION OF THE DRAWINGS

These and other objects and features of the present invention will become clear from the following description of the preferred embodiments given with reference to the accompanying drawings, in which.

DETAILED DESCRIPTION OF THE PREFERRED EMBODIMENTS

Embodiments of the invention will be described in detail hereinbelow by referring to the drawings.

First Embodiment

Figure 1:
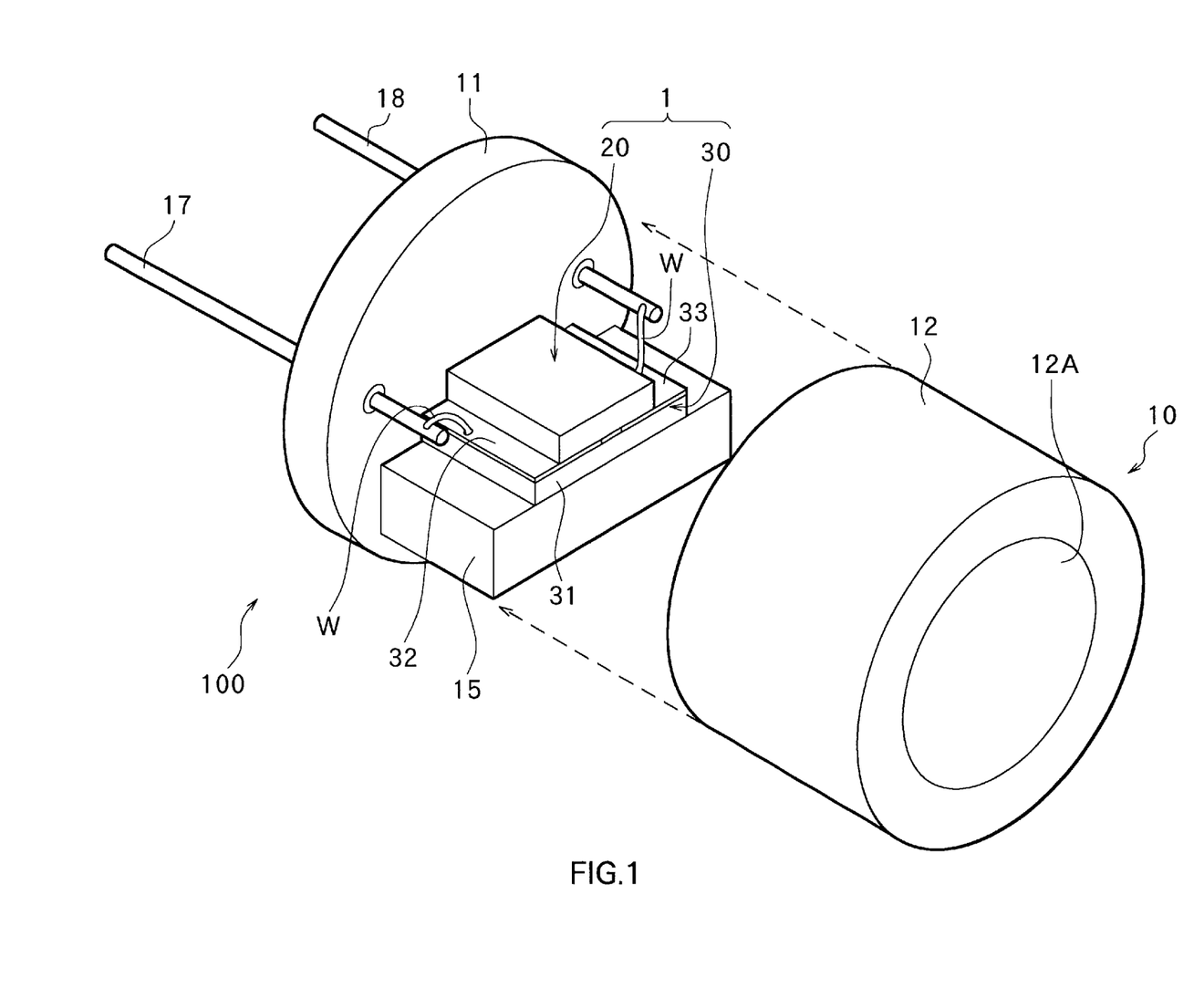
FIG. 1 is a perspective view showing a semiconductor applied to a semiconductor laser device of the first embodiment in the present invention.

FIG. 1 shows one example of a semiconductor light-emitting device 100 in which a semiconductor laser device is employed according to a first embodiment. The semiconductor light-emitting device 100 comprises the semiconductor laser device 1 inside a predetermined-shape package. The package 10 includes a supporting disk 11, a cylindrical lid 12 to be attached to the supporting disk 11. One end of the cylindrical lid 12 is closed but has a window 12A through which a laser beam emitted from the semiconductor laser device 1 passes to the outside of the package 10. The lid 12 is made of a metal such as copper (Cu) or iron (Fe) and the window 12A is made of a transparent glass or resin. Here, the semiconductor laser device 1 corresponds to one specific example of a semiconductor laser device of the present invention.

The supporting disk 11 contains metal such as copper or iron, and on its surface (a front of FIG. 1), a rectangular-shaped placing board 15 is formed integrally. The semiconductor laser device 1 is provided with a mounting plate 30, which is a board-shaped member and fixed on the placing board 15, and a laser tip 20 formed thereon. The placing board 15 and the mounting plate 30 support the laser tip 20, and at the same time, have a role for scattering heat of the laser tip 20. The supporting disk 11 is provided with a pair of pins 17 and 18, which maintains insulation with respect to the supporting disk 11, and is respectively connected through a wire W to lead electrode layers 32 and 33 described after. Additionally, the placing board 15 and the mounting plate 30 are also called a heat sink and a submount respectively. Here, the laser tip 20 corresponds to a specific example of a semiconductor tip in the present invention.

Figure 2:
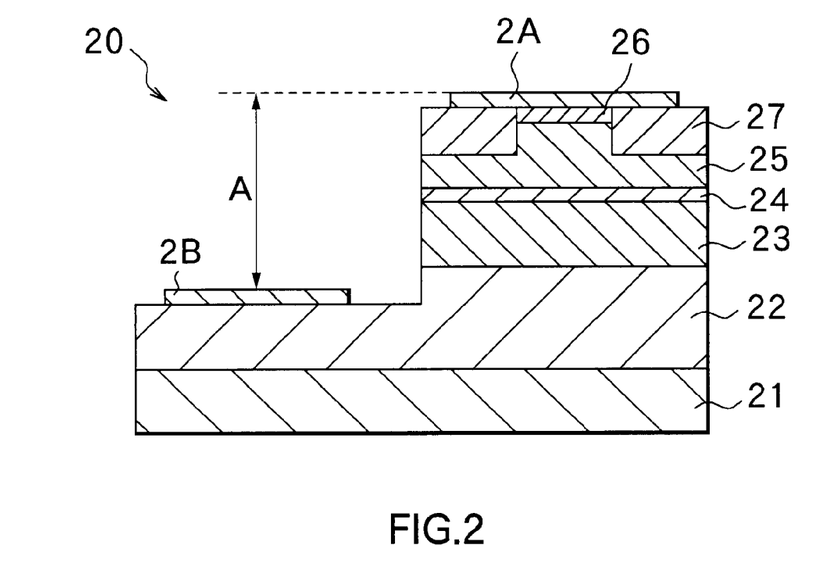
FIG. 2 is a cross sectional view showing a structure of a laser tip of the semiconductor shown in FIG. 1.

FIG. 2 is a cross sectional view showing a structure of the laser tip 20. The laser tip 20 includes a crystalline substrate 21 made of sapphire ($Al_2O_3$). The crystalline substrate 21 may be made of spinel ($MgAl_2O_4$), gallium nitride (GaN), silicon (Si), or silicon carbide (SiC) instead of sapphire. Formed on a surface of the n-type contact layer 22 is about 4 $\mu$m in thickness, for example. Formed on a surface of the n-type contact layer 22 is an n-type cladding layer 23 made of n-type AlGaN in which n-type impurities, e.g., silicon is doped. The thickness of the n-type contact layer 22 is an n-type cladding layer 23 is about 1.2 $\mu$m in thickness, for example.

An active layer 24 made of InGaN is formed on a surface of the n-type cladding layer 23. The active layer 24 having a light-trapping layer acts as a so called light-emitting layer. Formed on a surface of the active layer 24 is a p-type cladding layer 25 made of p-type AlGaN in which p-type impurities, e.g., Mg is doped. The thickness of the p-type cladding layer 25 is about 0.8 $\mu$m, for example. Formed on a surface of the p-type cladding layer 25 is a p-type contact layer 26 made of p-type GaN in which p-type impurities, e.g., Mg is doped. The thickness of the p-type contact layer 26 is about 0.3 $\mu$m, for example. A part of the p-type cladding layer 25 and the p-type cladding layer 26 is etched. A restricting layer 27 made with an insulating film such as silicon oxide or almina ($Al_2O_3$), is provided so as to sandwich the p-type cladding layer 25 and the p-type contact layer 26.

Formed on a surface of the p-type contact layer 26 is the p-side electrode 2A. The p-side electrode 2A is alloyed by sequentially stacking a nickel (Ni) layer and a gold (Au) layer from the side of the p-type contact layer 26 and then applying heat thereon, for example. A part of the n-type contact layer 22, the n-type cladding layer 23, the active layer 24, the p-type cladding layer 25 and the p-type contact layer 26 is etched and the n-type contact layer 22 is partly exposed. The n-side electrode 2B is formed on the exposed surface of the n-type contact layer 22. The n-side electrode 2B is alloyed, for example, by sequentially stacking a titanium (Ti) layer, an aluminum (Al) layer and a gold layer from the side of the n-type contact layer 22 and then applying heat thereon. The p-side electrode 2A and the n-side electrode 2B are formed in a belt-like shape extending in a direction perpendicular to the sheet of FIG. 2. The difference in height between the surface of the p-side electrode 2A and the surface of the n-side electrode 2B is about 3.5 µm, for example.

The surface of the p-side electrode 2A and that of the n-side electrode 2B are parallel to the surface of the crystalline substrate 21. The p-side electrode 2A is projected higher beyond the n-side electrode 2B, for example 2.7 µm. That is, a level difference represented as code A in the figures between a surface of the p-side electrode 2A and a surface B of the n-side electrode 2B is, for instance, 2.7 µm. Here, the p-side electrode 2A corresponds to an example of the first electrode film in the present invention. The n-side electrode 2B corresponds to a specific example of a second electrode film in the present invention.

The laser tip 20 has a pair of unillustrated reflecting mirrors in the both edges in a vertical direction relative to the figure. The mirrors have a structure overlaid a silicon dioxide layer and a zirconium oxide (ZrO) layer in turn, and formed in a manner that reflectivity of reflective mirror film is lower than that of the other. Light generated from the active layer 24 is amplified to and fro a pair of the reflective films, then emitted from one reflective mirror film as a laser beam.

Figure 3:
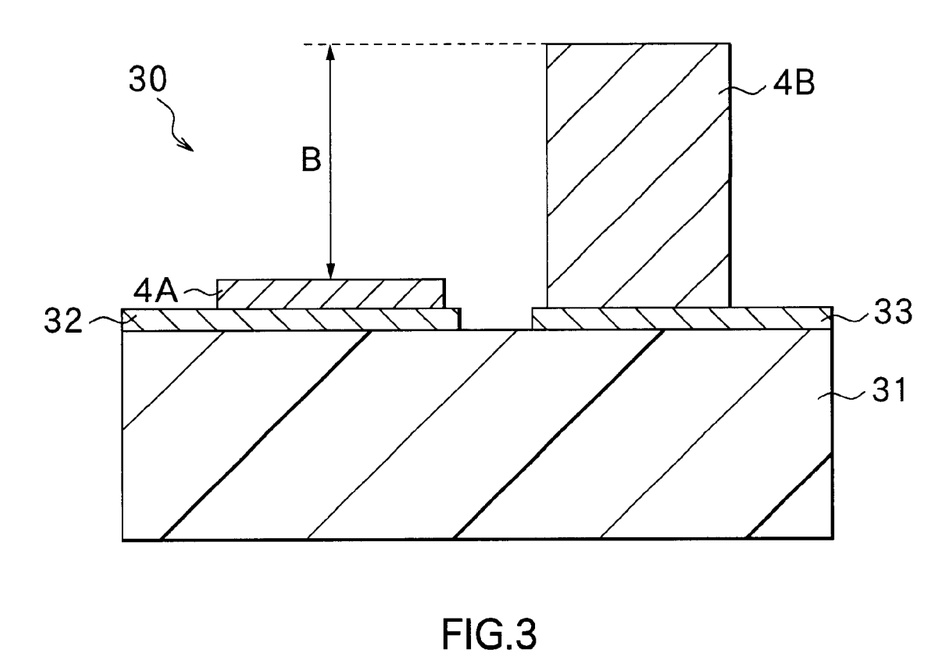
FIG. 3 is a cross sectional view showing a structure of a mounting plate of the semiconductor shown in FIG. 1.

FIG. 3 is a cross sectional view showing a structure of the mounting plate 30. The mounting plate 30 comprises lead electrode layers 32 and 33, solder films 4A and 4B on a supporting body 31, which is a board-shaped member with a rectangular shape. The supporting body 31 is made of insulating material with high thermal conductivity such as diamond, beryllium oxide (BeO), copper-tungsten (CuW), aluminum nitride (AlN), cubic boron nitride (cBN), silicon (Si), or silicon carbide (SiC). The size of mounting plate 30 is for instance, 200 µm of thickness, 0.6 mm of width (length in a left-right direction in the drawings), and 1 mm of depth (length in a depth direction in the drawings).

A surface of the supporting body 31 is a flat surface. A pair of the lead electrode layers 32 and 33 whose thickness is, for example, 10 µm, is formed thereon. The lead electrode layers 32 and 33 can be formed with gold or gold-tin alloy. The lead electrode layers 32 and 33 may have the structure of subsequently stacking a titanium layer, a platinum layer and a gold layer from the side of the mounting plate 30. As seen in FIG. 1, those lead electrodes 32 and 33 are electrically connected to a pair of the pins 17 and 18 disposed in the supporting disk 11 (FIG. 1) through the wire W respectively. Between both lead electrode layers 32 and 33, there is provided approximately a 50-µm interval. The lead electrode layers 32 and 33 correspond to examples of a first lead electrode layer and second electrode layer in the present invention.

The first solder film 4A and the second solder film 4B are formed on the lead electrode layers 32 and 33 of the mounting plate 30. The first and second solder films are formed with low-melting point metal such as tin, gold-tin alloy, tin-silver alloy (SnPt), indium-tin alloy (InSn) and indium (In). A thickness of the first solder film is 3.5 µm and that of second solder film 4B is 7 µm. That is, the level difference B between surfaces of the first solder film 4A and the second solder film 4B is 3.5 µm. The first and second solder films 4A and 4B respectively correspond to specific examples of "first and second solder films" in the present invention.

Method of Manufacturing Semiconductor Laser Device

Next, A method of manufacturing a semiconductor laser device of the embodiment will be explained.

First, as shown in FIG. 2, the n-side contact layer 22 made of n-type GaN, the n-type cladding layer 23 made of n-type AlGaN, the active layer 24 made of GaInN, the p-type cladding layer 25 made of p-type AlGaN, and the p-side contact layer 26 made of p-type GaN are grown in sequence on the surface of the crystalline substrate 21 made of, e.g., sapphire with MOCVD (Metal Organic Chemical Vapor Deposition).

After growing layers from the n-side contact layer 22 to the p-side contact layer 26, the p-type contact layer 26 and the p-type cladding layer 25 are partly etched with a lithography method and the restricting layer 27 made with, e.g., an insulating material is formed thereon. Subsequently, the p-side contact layer 26, the p-type cladding layer 25, the active layer 24 and the n-type cladding layer 23 are selectively removed to expose the n-side contact layer 22. Thereafter, the n-side electrode 2B is selectively formed on the exposed area of the n-side contact layer 22 and then the p-side electrode 2A is selectively formed on the p-side contact layer 26.

After forming the p-side electrode 2A and the n-side electrode 2B, the crystalline substrate 21 is cut vertically to the direction along the length of the p-side electrode 2A (in a vertical direction to the sheet of FIG. 8) with a predetermined width. After that, a pair of reflecting mirror films is formed on a pair of side surfaces of the cut semiconductor layer, respectively, and then the crystalline substrate 21 is cut parallel to along the length of the p-side electrode 2A with a predetermined width. Thus, the laser tip 20 is formed. As shown in FIG. 2, the level difference A (2.7 µm) is provided between the surfaces of the p-side electrode 2A and the n-side electrode 2B of this laser tip.

Following this, the lead electrode layers 32 and 33 are formed on the surface of the supporting body 31 with plating, sputtering or vacuum evaporation. Then, the first solder film 4A and the second solder film 4B are formed with vacuum evaporation on the surfaces of the lead electrode layers 32 and 33. This procedure forms the mounting plate 30. The level difference (3.2 µm) is provided between the surfaces of the first solder film 4A and the second solder film 4B of the mounting plate 30.

Figure 4A:
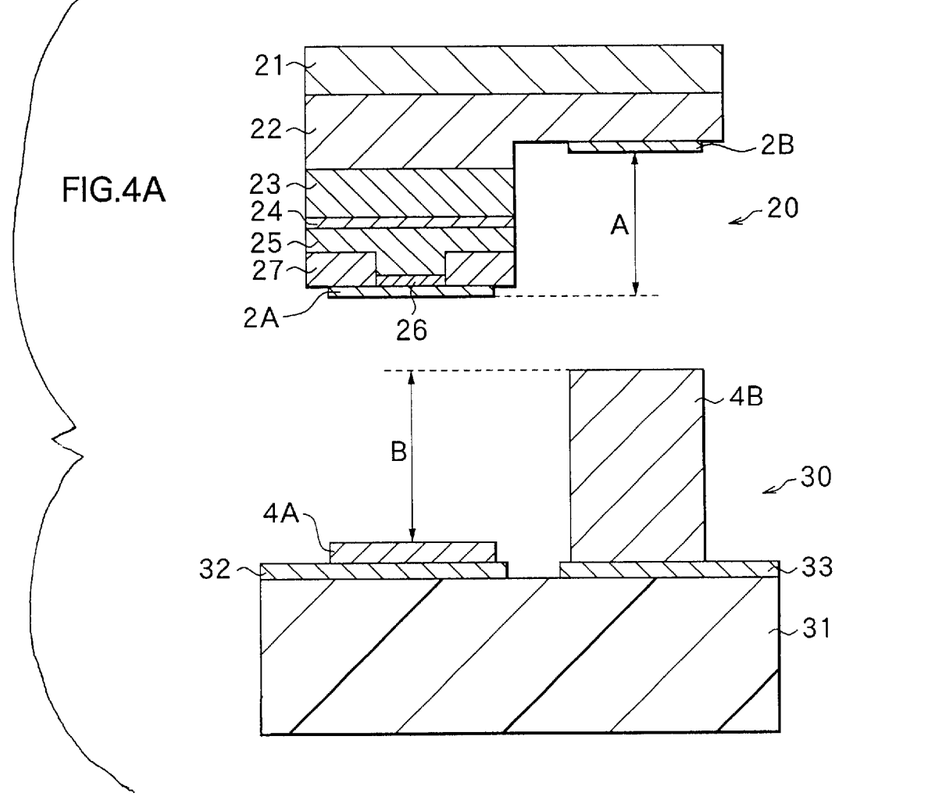
FIGS. 4A and 4B are a cross sectional views in every step for explanation of a method of manufacturing the semiconductor laser device shown in FIG. 1.

As shown in FIG. 4A, the laser tip is overlaid to the mounting plate 30 in an up-down state and the p-side electrode 2A and the n-side electrode 2B contact with the first solder film 4A and the second solder film 4B. Then, an unillustrated applying pressure apparatus applies pressure on the laser tip 20 and the mounting plate 30, for instance, with 5 g. of pressure power. This applying pressure is performed while keeping a parallel state between bases of the laser tip (a surface in FIGS. 4A and 4B) and the mounting plate 30. Further, the first solder film 4A and the second solder film 4B are heated and softened at about 280° C. This heating is preferably performed in an atmosphere of nitrogen gas or water gas, or in a mixture atmosphere of those gases to prevent oxidizing the first and second solder films 4A and 4B.

Figure 4B:
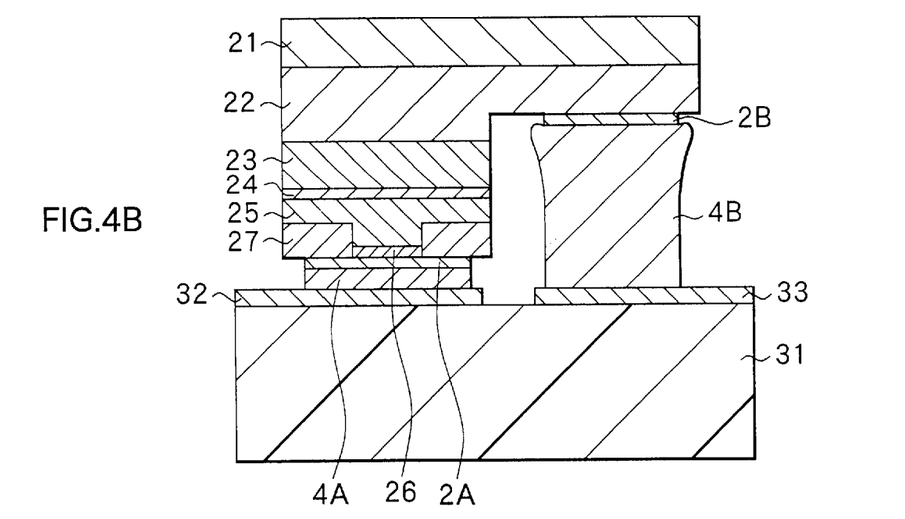

The level difference B (3.5 µm) of the mounting plate 30 is higher than the level difference A (2.7 µm) of the laser tip 20. For this reason, in case that the laser tip 20 and the mounting plate 30 are overlaid and applied to pressure, firstly, the n-side electrode 2B contacts with the second solder film 4B, then the p-side electrode 2A contacts with the first solder film 4A. This means that the deformation amount of the first solder film 4A (in an applying pressure direction) is smaller than that of the second solder film 4B. Thus, as shown in FIG. 4B, the p-side electrode 2A is prevented from squeezing out in the vicinity of the n-side electrode 2A even though the second solder film 4B is squeezed out in the vicinity of the n-side electrode 2B. As shown in FIG. 4B, the mounting plate 30 and the laser tip 20 are overlaid as mentioned above. Additionally, the p-side electrode 2A and the n-side electrode 2B are electrically connected to the lead electrode layers 32 and 33 respectively.

After completion of overlaying the mounting plate 30 and the laser tip 20, the back of the mounting plate 30 (an opposite side of the side of the laser tip) adheres to the placing board 15 formed integrally to the supporting disk 11 (FIG. 1) with soldering. Then, the lead electrode layer 32 of the mounting plate 30 is connected to the pin 17 through the wire W, and the lead electrode layer 33 is connected to the pin 18 through the wire W. Finally, the lid 12 formed separately is disposed in the supporting disk 11. This procedure forms the semiconductor light-emitting device 100 shown in FIG. 1.

The effect of the embodiment will be described hereinafter. As shown in FIGS. 4A and 4B, the level difference B (3.5 µm) of the mounting plate 30 is higher than the level difference A (2.7 µm) of the laser tip 20. Because of this, in case that the laser tip 20 and the mounting plate 30 are overlaid in a parallel state and applied to heat, the n-side electrode 2B first contacts with the second solder film 4B, next, the p-side electrode 2A contacts with the first solder film 4A. Accordingly, even though the second solder film 4B opposed to the n-side electrode 2B is squeezed out, the first solder film 4A opposed to the p-side electrode 2A is prevented from squeezing out. The pn junction part (or, stacking parts of the N-type cladding layer 23, the active layer 24 and the p-type cladding layer 25) is provided in the vicinity of the p-side electrode 2A. Therefore, if the first solder film 4A in the side of the p-side electrode is not squeezed out, there is no short circuit failure in the pn junction part.

Figure 5:
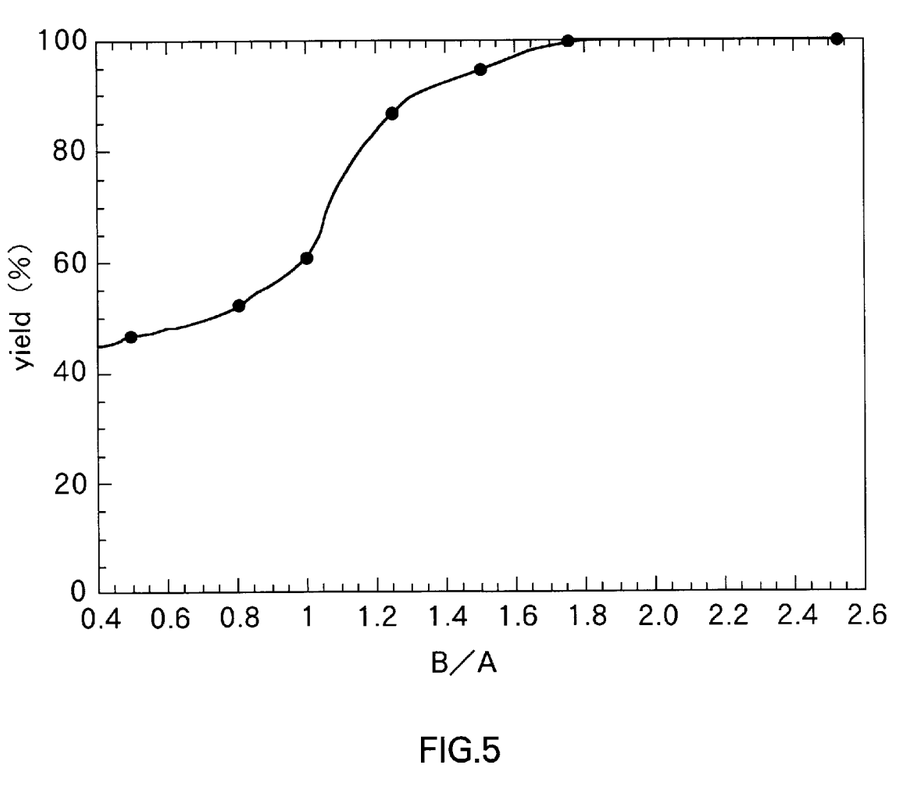
FIG. 5 is a cause and effect diagram for explanation of the effect of the first embodiment.

FIG. 5 is a cause and effect diagram showing a relationship of the short circuit failure and ratio between the level difference A in the laser tip 20 and the level difference B in the mounting plate 30. A plurality of semiconductor laser devices 1 is formed by changing the ratio between the level difference A in the laser tip 20 and that in the mounting plate 30. In each of the semiconductor laser devices, the yields of a short circuit failure are observed. In FIG. 5, the yields 100% means that there is no short circuit failure.

It is known from FIG. 5 that when the ratio of the level difference B in the mounting plate 30 relative to the level difference A in the laser tip 20, that is, B/A is larger than 1, the yields are greatly enhanced (this means that the short circuit failure dramatically reduced). As for the reason of this, it is considered that when B/A is larger than 1, the first solder film 4A in a side of the p-side of electrode 2A is hard to be squeezed out as shown in FIG. 4B.

In this technical field, as for the failure caused by the short circuit failure of the pn junction part, it is generally said that yields more than 80% are required. Thus, from FIG. 5, an expression: $1.2 \leq B/A \leq 3$ is much preferable. The limitation value, 3 is determined from the reason that if B/A is larger than 3, a large amount of solder is squeezed out in the vicinity of the n-side electrode 51, which is not preferable.

In addition, in case that the yield more than 90% is required for the yields of the short circuit failure, from FIG. 5, an expression: $1.3 \leq B/A \leq 2.5$ is preferable.

As explained above, according to the embodiment, for the reason of which the level difference between the first solder film 4A and the second solder film 4B is higher than the level difference between the p-side electrode 2A and the n-side electrode 2B, even if the second solder film 4B is squeezed out, the first solder film 4A is hardly squeezed out. Accordingly, the prevention of the short circuit failure in the pn junction part can be attained. Additionally, the solder is prevented from squeezing out in the vicinity of the p-side electrode 2A, so that the problems described after can be solved. Such problems are: a beam shape is changed by adhesion of the solder to an emitting part of the laser beam; and laser beam intensity decreases.

In case that the ratio of the level difference B of the mounting plate 30 relative to the level difference A of the laser tip 20 is determined as larger than 1.2 and lower than 3, the yields of the short circuit failure in the pn junction part can enhance more than 80%. Further preferably, in case that this ratio is determined as more than 1.3 and lower than 2.5, the yields of the short circuit failure in the pn junction part can enhance to more than 90%.

In the embodiment, the level difference B can be determined by a simple method for the following reasons: a, surface of the mounting plate 30 becomes a flat surface; and the lead electrode layers 32 and 33 become the same thickness in order to determine the level difference B of the mounting plate 30 by means of only a thickness of the first solder film 4A and of the second solder film 4B. On top of that, a level difference part may be provided with a surface itself of the mounting plate 30, or the lead electrode layers 32 and 33 may have different thickness. The solder films may be formed as stacked films comprised of more than two layers so as to change a thickness of a specific layer. Furthermore, in the embodiment, the first solder film 4A and the second solder film 4B are provided with the mounting plate 30, the solder films 4A and 4B may be provided with the p-side electrode 2A and the n-side electrode 2B of the laser tip.

Modification

Figure 6:
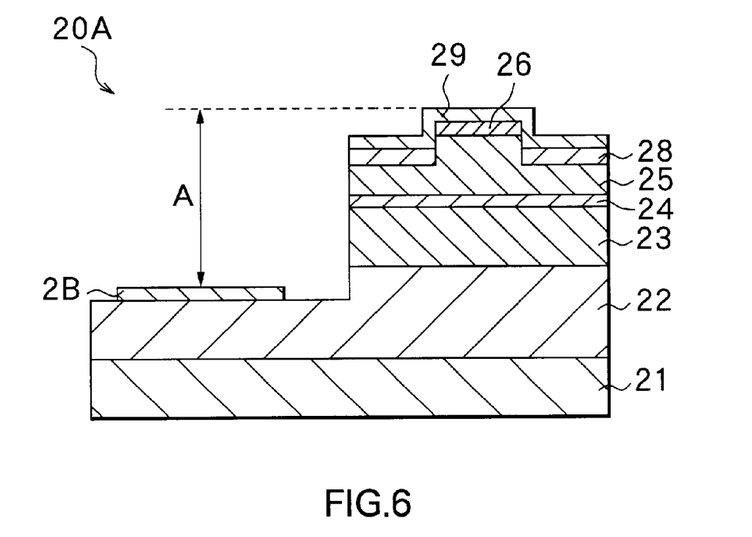
FIG. 6 is a cross sectional view for explanation of the major part of the semiconductor laser device relative to the second embodiment in the present invention.

FIG. 6 is a view showing a modification of the laser tip in the first embodiment. A laser tip 20A shown in FIG. 6 has the same configurations as the laser tip of the first embodiment except shapes of the p-side electrode and the restricting layer. Hereinafter, the same configurations as the first embodiment have the same numeral references and the detailed explanation will be omitted. The restricting layer 28 relative to the modification is formed in a part in which the p-type contact layer 26 and the p-type cladding layer 25 are removed by etching. This restricting layer 28 is also formed in a manner that its surface does not reach the p-type contact layer 26. That is, the p-type contact layer 26 has a structure which projects upwardly from the restricting layer 28. Additionally, the p-side electrode layer 29 of the modification is formed in a manner to cover the projected p-type contact layer 26 and the front of the restricting layer 28 formed in the both sides of the layer 26.

The semiconductor laser device shown in FIG. 1 can be achieved by overlaying the laser tip 20A to the mounting plate 30 shown in FIG. 4. In the modification, in case that the level difference B between the first solder film 4A and the second solder film 4B of the mounting plate 30 (FIG. 4) is higher than the level difference A of the laser tip 20A (a level difference between the top surface of the p-side electrode 29 and the surface of the n-side electrode 28), which prevents the short circuit failure of the pn junction part occurring.

Second Embodiment

Figure 7:
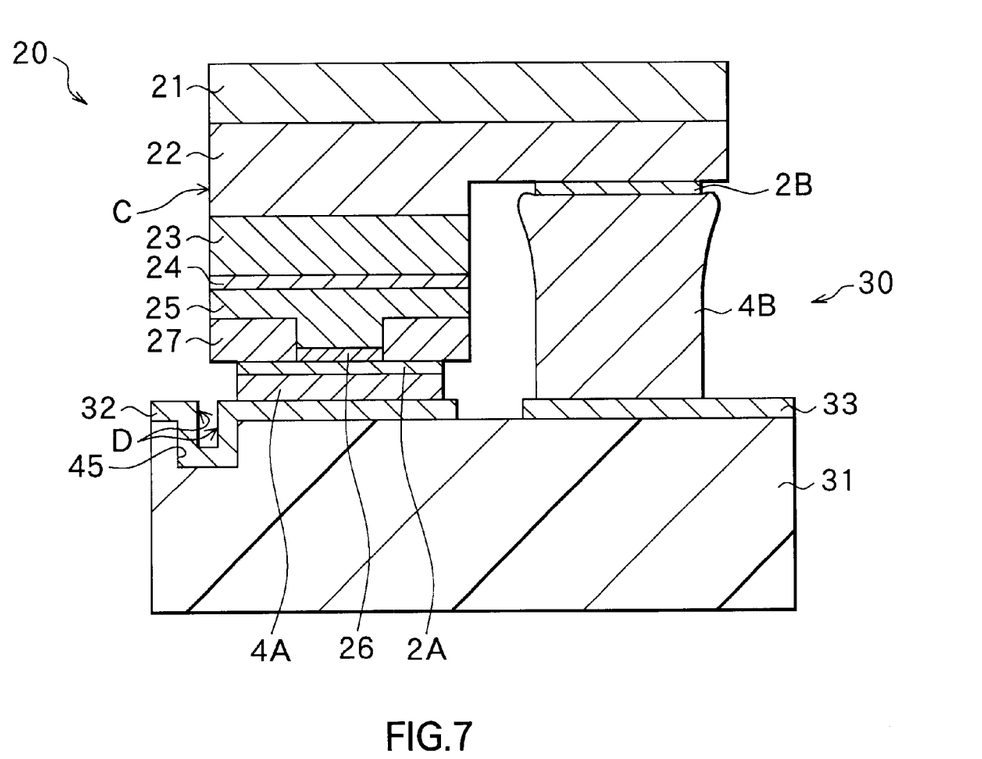
FIG. 7 is a cross sectional view for explanation of the major part of the semiconductor laser device relative to the third embodiment in the present invention.

Next, the second embodiment of the present invention will be explained. FIG. 7 is a cross sectional view showing a main part of the semiconductor laser device relative to the second embodiment. This embodiment has the same configuration as the first embodiment except a configuration of a mounting plate 30A. Hereinafter, the same configurations have the same numeral references as the first embodiment and the detailed explanation will be omitted.

As shown in FIG. 7, on a surface of the mounting plate 30A, a trench 45 is formed in the vicinity of the first solder film 4A opposed to the p-side electrode 2A. The trench 45 is formed in a position in which an opposite side of the second solder film 4B within the first solder film 4A in between, as distinct from a position between the both solder films 4A and 4B. The trench 45 is 50 $\mu$m of depth, 100 $\mu$m of width, and formed parallel to an extension direction of the p-side electrode 2A (a Y-direction in the figure). That is, the trench 45 is formed extensively in a vertical direction relative to the figure. The trench 45 may be formed with a dicing saw and so on. The lead electrode layer 32 positioned in a bottom of the first solder film 4A is formed sequentially to the inside of the trench 45 as maintaining almost the same thickness. The trench 45 corresponds to a specific example of the trench in the present invention.

In case that a direction parallel to the surface of the supporting body 31 and at the same time, orthogonal to an extension direction of the p-side electrode 2A (the Y-direction in FIG. 7) is defined as a X-direction, a side edge surface C of the laser tip 20 is positioned in a center line between two side walls D of the trench 45 covered with the lead electrode layer 32. Accordingly, even if the first solder film 4A opposed to the p-side electrode 2A is squeezed out, the squeezed-out solder does not flow to the pn junction part of the laser tip 20, but flows into the trench 45 along the lead electrode layer 32. This further prevents form adhering the solder to the pn junction part of the laser tip 20.

As mentioned above, in the embodiment, the trench 45 is formed in the vicinity of the first solder film 41 opposed to the p-side electrode 2A in the mounting plate 30, therefore, even if the solder is squeezed out from the side of the p-side electrode 2A, the squeezed-out solder is surely prevented adhering to the pn junction part. For this reason, the occurrence of the sort circuit failure is further controlled than in the first embodiment. In addition, the lead electrode layer 32 under the first solder film 4A is formed sequentially to the inside of the trench 45 so that the squeezed-out solder can be leaded to the inside of the trench 45 effectively.

The second embodiment of the present invention also can be applied to a case that the level difference B between the first solder film 4A and the second solder film 4B of the mounting plate 30 is shorter than the level difference A between the p-side electrode 2A and the n-side electrode 2B of the laser tip 20, or to a case that the level differences A and B are the same size. On top of that, the trench 45 is formed in the vicinity of the first solder film 4A of the mounting plate 30, which can allow the squeezed-out solder to flow into the trench, consequently, the short circuit failure of the pn junction part can be controlled.

Third Embodiment

Figure 8:
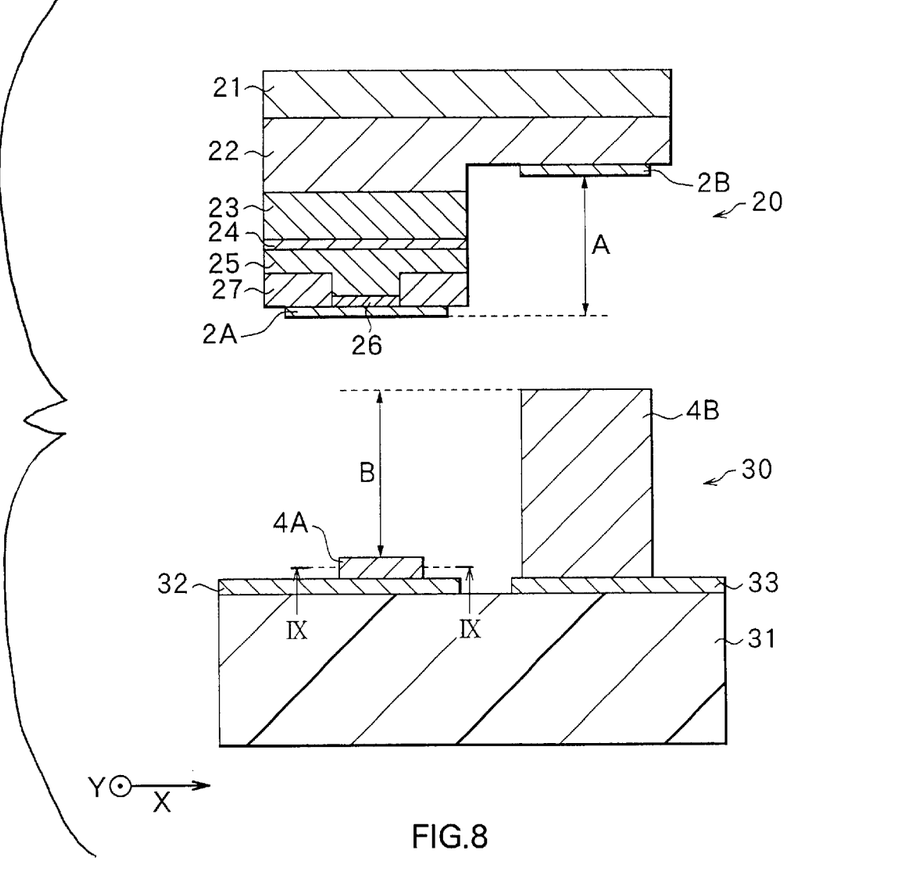
FIG. 8 is a VIII—VIII line arrow sectional view in FIG. 7.
Figure 9:
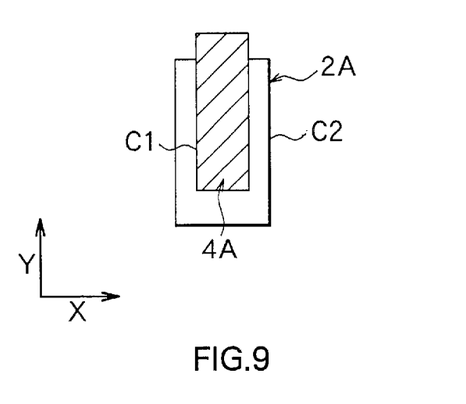
FIG. 9 is an IX—IX line arrow cross sectional view in FIG. 8.

Finally, the third embodiment will be explained hereinafter. FIG. 8 is a cross sectional view showing the semiconductor laser device relative to the third embodiment. FIG. 9 is an IX—IX line arrow cross sectional view in FIG. 8. The third embodiment has the same configurations as the first embodiment except a different shape of the first solder film 4A. As described below, the same configurations as the first embodiment have the same numeral references and the detailed explanation will be omitted. In FIG. 8, a resonance direction of the laser tip 20, or, an extension direction of the p-side electrode 2A (an orthogonal direction relative to a drawing in FIG. 8) is defined as a Y-direction. On the other hand, a direction parallel to a mounting plate 31 and at the same time, vertical to the Y-direction is defined as an X-direction.

In the third embodiment, at least, in the X-direction, an outline C1 of a contact surface (the top surface in FIG. 9) of the first solder film 4A is positioned inwardly from an outline C2 of a contact surface (the base surface in FIG. 9) of the p-side electrode 2A as shown in FIG. 9. More preferably, the size of the contact surface of the first solder film 4A is formed in a manner to be smaller than that of the contact surface of the p-side electrode 2A. For the configuration as mentioned above, when the laser tip 20 is overlaid to the mounting plate 30, even if the first solder film 4A is deformed outwardly, the solder hardly reaches the side edge surface of the p-side electrode 2A. Accordingly, adhesion of the solder to the pn junction part can be controlled.

Hereinbelow, an example of an effect of the embodiment will be explained. The p-side electrode 2A is formed with a rectangular shape as shown in FIG. 9 and its long sides are determined as 700 $\mu$m, its short sides are determined as 250 $\mu$m. On the other hand, the first solder film 4A is formed with a rectangular shape as shown in FIG. 9 and its long sides are determined as 680 $\mu$m, its short sides are determined as 200 $\mu$m. The outline C1 of the first solder film 4A is positioned inwardly from the outline C2 of the p-side electrode 2A in the X-direction and is positioned outwardly from the outline C2 of the p-side electrode 2A in the Y-direction. In case that the laser tip 20 and the mounting plate 30 are overlaid and occurrence of the short circuit failure in the pn junction part of the laser tip 20 is observed, the yield of the short circuit failure is 98%. On the other hand, in case that the p-side electrode 2A and the first solder film 4A has the same shape of the contact surface, that is, both solder films have a rectangular shape whose long sides are 700 $\mu$m and short sides are 250 $\mu$m, and the outlines of the p-side electrode 2A and the first solder film 4A are overlapped, the yield of the short circuit failure is 80%. This proves that the embodiment enhances the yield of the short circuit failure by 1.2 times.

In the embodiment, the outline C1 of the contact surface of the first solder film 4A may be positioned inwardly from the outline C2 of the p-side electrode 2A in both X and Y-directions.

Moreover, the embodiment can be applied to the case that the level difference B between the first solder film 4A and the second solder film 4B of the mounting plate 30 is shorter than the level difference A between the p-side electrode 2A and the n-side electrode 2B of the laser tip 20, or those level differences are the same size. The outline of the solder film 4A is positioned inwardly from the outline the p-side electrode 2A, which can control the solder not to be squeezed out the outside of the p-side electrode 2A, thereby, the occurrence of the short circuit failure in the pn junction part can be prevented. Additionally, in the third embodiment, the trench 45 of the second embodiment may be formed in the mounting plate 30.

While the invention has been described with reference to specific embodiments chosen for purpose of illustration, it should be apparent that numerous modifications could be made thereto by those skilled in the art without departing from the basic concept and scope of the invention. For example, the present invention is not limited by the semiconductor but light emitting diode also can be applied. As for a structure of the semiconductor light-emitting device 100, various structures may be applied other than the structure shown in FIG. 1.

As has been explained above, according to the method of one aspect of the present invention, when the semiconductor tip and the mounting plate are overlapped within the first and second solder films in between, the deformation amount of the first solder film contacted with the first electrode whose deformation amount is greater than the other, becomes smaller than that of the second solder film contacted with the second electrode film. Thus, the solder in the first electrode film is hardly squeezed out. Accordingly, the solder hardly adheres to the pn junction part, which is generally disposed in the side of the first electrode film. This prevents the short circuit failure in the pn junction part. Furthermore, the solder hardly adheres to the pn junction part, which prevents change of a beam shape and decrease of a beam output.

According to the method of manufacturing the semiconductor light-emitting device, or the mounting plate of another aspect of the present invention, the level difference between the first and second solder films are higher than the level difference between the first and second electrode films. Therefore, when the semiconductor tip and the mounting plate are overlapped, first, the second electrode film contacts with the second solder film, and then the first electrode film contacts with the first solder film. Hence, the solder hardly adheres to the pn junction part, which is generally disposed in the first electrode film side. This prevents the short circuit failure in the pn junction part. Further, the solder hardly adheres to the pn junction part, which prevents change of a beam shape and decrease of a beam output.

According to the semiconductor light-emitting device, or mounting plate the supporting body of still another aspect of the invention, the trench is formed in the opposite side of the second solder film within the first solder film in between. Therefore, even if the first solder film is squeezed out, it flows into the trench, which prevents adhesion of the solder to the pn junction. Thereby, this can prevent the short circuit failure in the pn junction part accompanying by the squeezed-out solder, change of a beam shape and decrease of a beam output.

According to the method of manufacturing the semiconductor light-emitting device of a further aspect of the present invention, at least in a specific direction, the outline of the first solder film is positioned inwardly from the outline of the first electrode film. This controls the first solder film not to be squeezed out from the outside of the outline of the first electrode film, which prevents the short circuit failure in the pn junction part accompanying by the squeezed-out solder, change of a beam shape, and decrease of a beam output.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a semiconductor light-emitting device including a semiconductor tip having a first electrode film and a second electrode film on the same side of a base, and a mounting plate having a first solder film and a second solder film in the same side of a supporting body, comprising a step of:

overlaying the first electrode film and the second electrode film of the semiconductor tip to the first solder film and the second solder film respectively; and wherein a level difference is provided in a manner that a surface of the first electrode film is projected beyond a surface of the second electrode film therebetween in the semiconductor tip;

a level difference is provided in a manner that a surface of the first solder film is projected beyond a surface of the second solder film therebetween in the mounting plate;

the level difference of the first and second solder films therebetween in the mounting plate is determined in a manner to be higher than the level difference of the first and second electrode films in therebetween the semiconductor tip;

wherein the level difference in the semiconductor tip represents as A, and the level difference in the mounting plate represents as B:

wherein the expression: $1.2 \leq B/A \leq 3$ can be formed.

2. A method of manufacturing a semiconductor light-emitting device including a semiconductor tip having a first electrode film and a second electrode film on the same side of a base, and a mounting plate having a first solder film and a second solder film in the same side of a supporting body, comprising a step of:

overlaying the first electrode film and the second electrode film of the semiconductor tip to the first solder film and the second solder film respectively; and wherein a level difference is provided in a manner that a surface of the first electrode film is projected beyond a surface of the second electrode film therebetween in the semiconductor tip;

a level difference is provided in a manner that a surface of the first solder film is projected beyond a surface of the second solder film therebetween in the mounting plate;

the level difference of the first and second solder films therebetween in the mounting plate is determined in a manner to be higher than the level difference of the first and second electrode films in therebetween the semiconductor tip;

wherein the level difference in the semiconductor tip represents as A, and the level difference in the mounting plate represents as B wherein the expression: $1.3 \leq B/A \leq 2.5$ can be formed.

3. A method of manufacturing the semiconductor light-emitting device according to either of claims 1 or 2, wherein the supporting body has a flat surface where the first solder film and the second solder film are formed thereon; and a thickness of the first and the second solder films is determined in a manner to be different each other.

4. A method of manufacturing the semiconductor light-emitting device according to either of claims 1 or 2, wherein a first lead electrode layer and a second lead electrode layer are respectively formed between each of the first and the second solder films and the supporting body.

5. A method of manufacturing the semiconductor light-emitting device according to either of claims 1 or 2, wherein the trench is formed in the vicinity of the first solder film in the supporting body.

6. A method of manufacturing the semiconductor light-emitting device according to either of claims 1 or 2, wherein the semiconductor tip is comprised as a laser tip having an optical resonator; and an outline of the first solder film in a contact surface between the first electrode film and the first solder film is positioned inwardly from an outline of the first electrode film at least in a vertical direction relative to a resonance direction of the optical resonator.

7. A mounting plate utilized by overlaying to a semiconductor tip having a first electrode film and a second electrode film formed in the same side of a base, and having a level difference in a manner that a surface of a first electrode film is projected beyond a surface of a second electrode film therebetween, the mounting plate comprising:

a first solder film and a second solder film formed in the same side of a supporting body; and wherein a level difference is provided in a manner that a surface of the first solder film is projected beyond a surface of the second solder film therebetween; and the level difference between the first solder film and the second solder film is higher than the level difference in the semiconductor tip;

wherein the predetermined level difference of the semiconductor tip represents as A, and the level difference of the base represents as B wherein the expression: $1.2 \leqq B/A \leqq 3$ can be formed.

8. A mounting plate utilized by overlaying to a semiconductor tip having a first electrode film and a second electrode film formed in the same side of a base, and having a level difference in a manner that a surface of a first electrode film is projected beyond a surface of a second electrode film therebetween, the mounting plate comprising:

a first solder film and a second solder film formed in the same side of a supporting body; and wherein a level difference is provided in a manner that a surface of the first solder film is projected beyond a surface of the second solder film therebetween; and the level difference between the first solder film and the second solder film is higher than the level difference in the semiconductor tip;

wherein the expression: $1.3 \leqq B/A \leqq 2.5$ can be formed.

9. The mounting plate according to either of claims 7 or 8, wherein the supporting body having a flat surface where the first solder film and the second solder film are formed thereon; and a thickness of the first and the second solder films is determined to be different each other.

* * * * *